(12) United States Patent
Po

(10) Patent No.: US 10,410,691 B2
(45) Date of Patent: Sep. 10, 2019

(54) NON-VOLATILE MEMORY WITH A NEW SENSING SEQUENCE CONTROL METHOD

(71) Applicant: eMemory Technology Inc., Hsin-Chu (TW)

(72) Inventor: Chen-Hao Po, Hsinchu (TW)

(73) Assignee: EMEMORY TECHNOLOGY INC., Hsin-Chu (TW)

( * ) Notice: Subject to any disclaimer, the term of this patent is extended or adjusted under 35 U.S.C. 154(b) by 0 days.

(21) Appl. No.: 16/115,999

(22) Filed: Aug. 29, 2018

(65) Prior Publication Data

US 2019/0214059 A1 Jul. 11, 2019

Related U.S. Application Data

(60) Provisional application No. 62/615,463, filed on Jan. 10, 2018.

(30) Foreign Application Priority Data

Jul. 31, 2018 (TW) .............................. 107126556 A

(51) Int. Cl.
*G11C 7/02* (2006.01)
*G11C 7/08* (2006.01)
*G11C 7/06* (2006.01)

(52) U.S. Cl.
CPC ................ *G11C 7/08* (2013.01); *G11C 7/065* (2013.01)

(58) Field of Classification Search
CPC .................................. G11C 7/08; G11C 7/065
USPC .......................................................... 365/207
See application file for complete search history.

(56) References Cited

U.S. PATENT DOCUMENTS

| 6,125,059 | A * | 9/2000 | Hecht | G11C 16/14 326/39 |
|---|---|---|---|---|
| 6,501,696 | B1 * | 12/2002 | Mnich | G11C 7/065 365/190 |
| 8,536,898 | B2 | 9/2013 | Rennie et al. | |
| 9,082,500 | B1 * | 7/2015 | Ku | G11C 16/26 |
| 9,978,452 | B2 * | 5/2018 | Tailliet | G11C 16/0408 |
| 2005/0213359 | A1 * | 9/2005 | Kim | G11C 15/00 365/49.1 |
| 2006/0092740 | A1 * | 5/2006 | Nii | G11C 8/10 365/221 |

* cited by examiner

*Primary Examiner* — Tha-O H Bui
(74) *Attorney, Agent, or Firm* — WPAT, PC

(57) ABSTRACT

A non-volatile memory includes a sense amplifier, a switching element and a power switching circuit. A first sub-cell is connected with a word line, a bit line and a source line. A second sub-cell is connected with the word line, an inverted bit line and an inverted source line. During a read cycle, an activation period of the word line contains a first period and a second period. In the first period, the first sub-cell generates a first read current to a first current path, and the second sub-cell generates a second read current to a second current path. The first current path and the second current path are controlled to be opened according to the correlation of the first read current and the second read current.

10 Claims, 6 Drawing Sheets

NON-VOLATILE MEMORY WITH A NEW SENSING SEQUENCE CONTROL METHOD

This application claims the benefit of U.S. provisional application Ser. No. 62/615,463, filed Jan. 10, 2018 and Taiwan application Serial No. 107126556, filed Jul. 31, 2018, the subject matters of which are incorporated herein by references.

FIELD OF THE INVENTION

The present invention relates to a non-volatile memory, and more particularly to a non-volatile memory with a new sensing sequence control method.

BACKGROUND OF THE INVENTION

FIG. 1A is a schematic circuit diagram illustrating a conventional differential cell. As shown in FIG. 1A, the differential cell c1 comprises two sub-cells cx and cy. Each of the sub-cells cx and cy comprises a floating gate transistor. Consequently, the differential cell c1 is a floating gate type differential cell.

The sub-cell cx comprises a floating gate transistor M1. The sub-cell cy comprises a floating gate transistor M2. A control terminal of the floating gate transistor M1 is connected with a word line WL. A drain terminal of the floating gate transistor M1 is connected with a bit line BL. A source terminal of the floating gate transistor M1 is connected with a source line SL. A control terminal of the floating gate transistor M2 is connected with the word line WL. A drain terminal of the floating gate transistor M2 is connected with an inverted bit line BLb. A source terminal of the floating gate transistor M2 is connected with an inverted source line SLb. When proper bias voltages are provided to the word line WL, the bit line BL, the inverted bit line BLb, the source line SL and the inverted source line SLb, a program action or a read action is performed on the differential cell c1.

While the program action is performed on the differential cell c1, the sub-cells cx and cy of the differential cell c1 are in a complementary state. For example, in case that the sub-cell cx is programmed to an on state, the sub-cell cy is programmed to an off state. Whereas, in case that the sub-cell cx is programmed to the off state, the sub-cell cy is programmed to the on state.

While the read action is performed on the differential cell c1, the word line WL is activated. When the word line WL is activated, the sub-cell in the on state generates a higher cell current and the sub-cell in the off state generates a lower cell current. The cell current generated by the sub-cell in the off state is nearly zero. According to the result of comparing the cell currents from the two sub-cells, the storage state of the differential cell c1 is determined. Generally, the cell current is a read current during the read cycle.

In case that the sub-cell cx is programmed to the on state and the sub-cell cy is programmed to the off state during the program cycle, the read current Ix from the sub-cell cx is higher than the read current Iy from the sub-cell cy during the read cycle. Under this circumstance, the differential cell c1 is judged to be in a first storage state.

In case that the sub-cell cx is programmed to the off state and the sub-cell cy is programmed to the on state during the program cycle, the read current Ix from the sub-cell cx is lower than the read current Iy from the sub-cell cy during the read cycle. Under this circumstance, the differential cell c1 is judged to be in a second storage state.

In FIG. 1A, the sub-cell cx comprises the n-type floating gate transistor M1, and the sub-cell cy comprises the n-type floating gate transistor M2. In practice, the differential cell c1 has other structures. For example, the differential cell is a floating gate type differential cell comprising two p-type floating gate transistors, or the differential cell is an antifuse type differential cell comprises two antifuse type transistors.

FIG. 1B is a schematic circuit diagram illustrating a memory cell array comprising differential cells. The memory cell array 110 comprises m×n differential cells c11~cmn.

In the memory cell array 110, m word lines WL1~WLm are connected with the corresponding m rows of n differential cells. The n differential cells in the same row are connected with n bit line pairs (BL1, BLb1)~(BLn, BLbn) and n source line pairs (SL1, SLb1)~(SLn, SLbn). Each bit line pair comprises a bit line and an inverted bit line. Each source line pair comprises a source line and an inverted source line.

For example, the differential cell c11 in the first row is connected with the word line WL1, the bit line pair (BL1, BLb1) and the source line pair (SL1, SLb1). The connecting relationships between the other differential cells c12~c1n and the associated lines are similar to the connecting relationships between the differential cell c11 and the associated lines, and are not redundantly described herein.

During a program cycle, one of the m word lines WL1~WLm is activated. The row corresponding to the activated word line is referred as a selected row. The n differential cells in the selected row are referred as selected differential cells. In addition, the n differential cells are programmed. While the program action is performed, the two sub-cells of each selected differential cell of the selected row are programmed to be in the complementary state.

During a read cycle, one of them word lines WL1~WLm is activated and a selected row is determined. Meanwhile, each selected differential cell of the selected row generates read currents to the corresponding bit line pair. According to the result of comparing the read currents of the bit line pair with each other, the storage state of the corresponding differential cell is determined.

During the read cycle of the conventional memory cell array and an activation period of one word line, each selected differential cell of the selected row generate read currents to the corresponding bit line and the corresponding inverted bit line. When the activation period of the word line is ended, the selected differential cell stops generating the read currents.

SUMMARY OF THE INVENTION

An embodiment of the present invention provides a non-volatile memory. The non-volatile memory includes a memory cell array, a sense amplifier, a switching element and a power switching circuit. The memory cell array includes a word line, a bit line, an inverted bit line, a source line and an inverted source line. A first sub-cell of a selected differential cell is connected with the word line, the bit line and the source line. A second sub-cell of the selected differential cell is connected with the word line, the inverted bit line and the inverted source line. The sense amplifier includes a data line and an inverted data line. The sense amplifier generates an output signal and an inverted output signals according to signals from the data line and the inverted data line. The switching element includes a first switching circuit and a second switching circuit. The first switching circuit is connected between the data line and the bit line. The second switching circuit is connected between the inverted data line and the inverted bit line. The power switching circuit is connected with the bit line, the inverted bit line, the source line and the inverted source line. During a read cycle, an activation period of the word line contains a first period and a second period. In the first period, the first sub-cell generates a first read current to a first current path, which is defined by the data line, the first switching circuit, the bit line, the first sub-cell, the source line and the power switching circuit. In the first period, the second sub-cell generates a second read current to a second current path, which is defined by the inverted data line, the second switching circuit, the inverted bit line, the second sub-cell, the inverted source line and the power switching circuit. The first current path and the second current path are controlled to be opened according to the correlation of the first read current and the second read current.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1A:
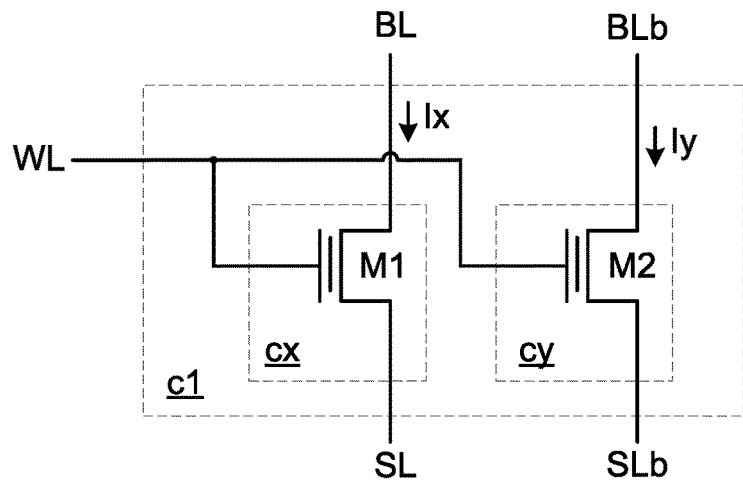
FIG. 1A (prior art) is a schematic circuit diagram illustrating a conventional differential cell.
Figure 1B:
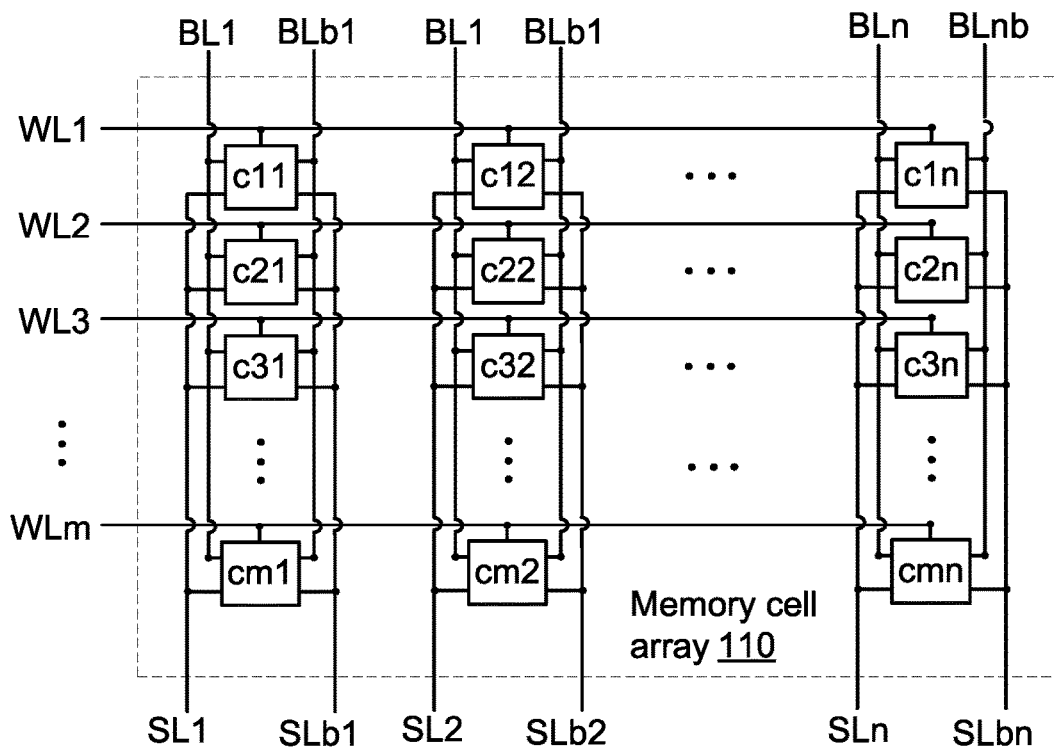
FIG. 1B (prior art) is a schematic circuit diagram illustrating a memory cell array comprising differential cells.
Figure 2:
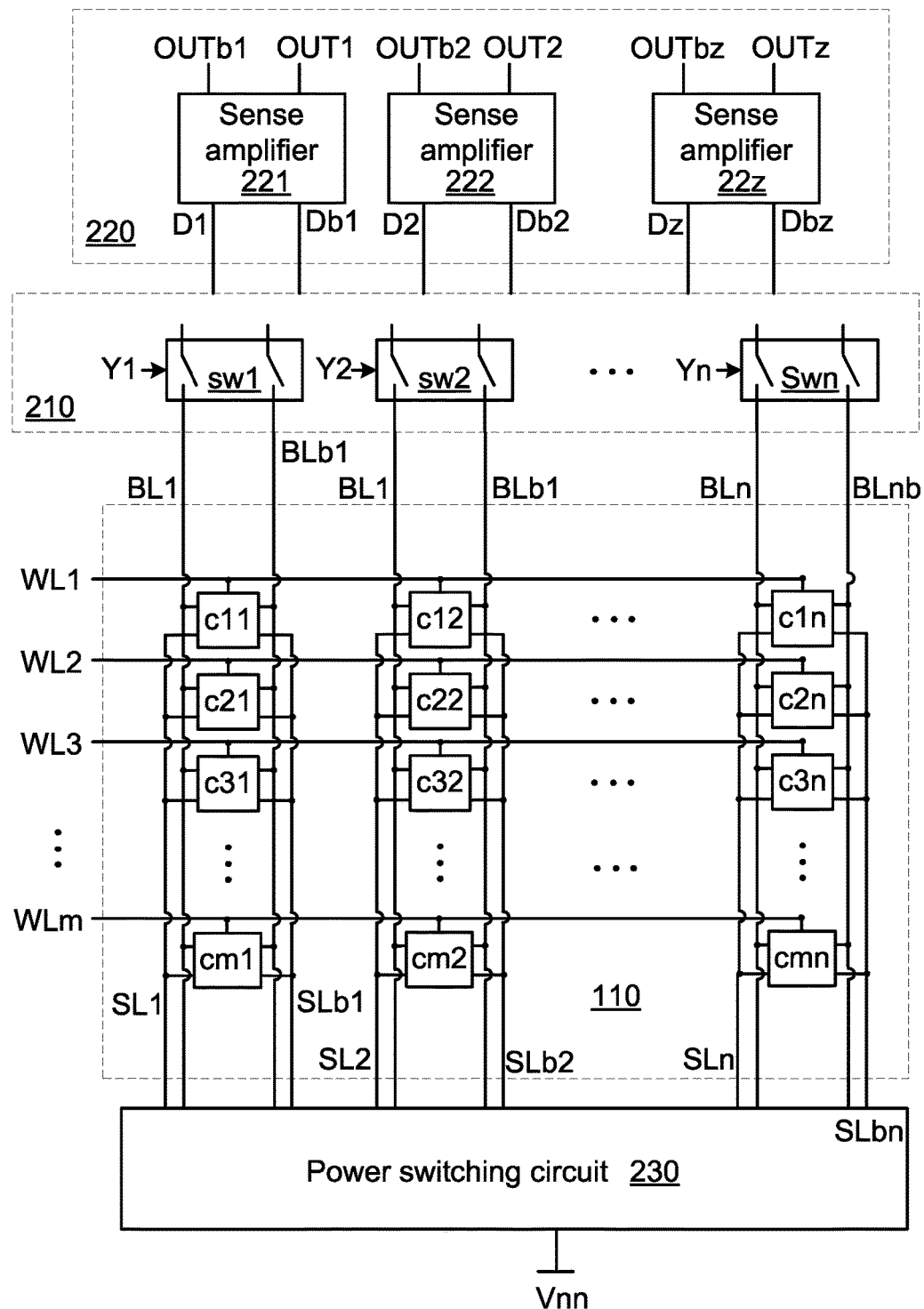
FIG. 2 schematically illustrates the architecture of a non-volatile memory of the present invention.

FIG. 2 schematically illustrates the architecture of a non-volatile memory of the present invention. As shown in FIG. 2, the non-volatile memory comprises a power switching circuit 230, a memory cell array 110, a selecting circuit 210, a sensing circuit 220 and a control circuit (not shown). The memory cell array 110 comprises plural differential cells. The structure of the memory cell array 110 is similar to that of FIG. 1B, and is not redundantly described herein.

The power switching circuit 230 is connected with the n source line pairs (SL1, SLb1)~(SLn, SLbn) and the n bit line pairs (BL1, BLb1)~(BLn, BLbn) of the memory cell array 110. While a program action or a read action of the non-volatile memory is performed, the power switching circuit 230 provides proper bias voltages to the memory cell array 110.

The selecting circuit 210 comprises n switching elements sw1~swn. The n switching elements sw1~swn are connected with the corresponding bit line pairs (BL1, BLb1)~(BLn, BLbn).

The sensing circuit 220 comprises z sense amplifiers 221~22z. The z sense amplifiers 221~22z comprise corresponding data line pairs (D1, Db1)~(Dz, Dbz), respectively. According to the signals from the data line pairs (D1, Db1)~(Dz, Dbz), the sense amplifiers 221~22z generate corresponding complementary output signal sets (OUT1, OUTb1)~(OUTz, OUTbz).

In accordance with a feature of the present invention, the n bit line pairs (BL1, BLb1)~(BLn, BLnb) are classified into plural bit line pair groups by the selecting circuit 210. According to n select signals Y1~Yn, the bit line pairs of one of the bit line pair groups are connected with the z sense amplifiers 221~22z under control of the control circuit.

For example, the memory cell array 110 comprises 32 bit line pairs, and the sensing circuit 220 comprises 8 sense amplifiers. Consequently, the 32 bit line pairs of the memory cell array 110 are classified into 4 groups.

During a first read cycle of the read action, the first group of 8 bit line pairs corresponding to the selected row are connected with the 8 sense amplifiers of the sensing circuit 220 by the selecting circuit 210, and 8 complementary output signal sets are generated. Similarly, during a second read cycle of the read action, the first group of 8 bit line pairs corresponding to the selected row are connected with the 8 sense amplifiers of the sensing circuit 220 by the selecting circuit 210, and 8 complementary output signal sets are generated. After four read cycles, the 32 bit line pairs of the memory cell array 110 are sequentially connected with the sensing circuit 220, and the storage states of the 32 differential cells are determined.

Figure 3A:
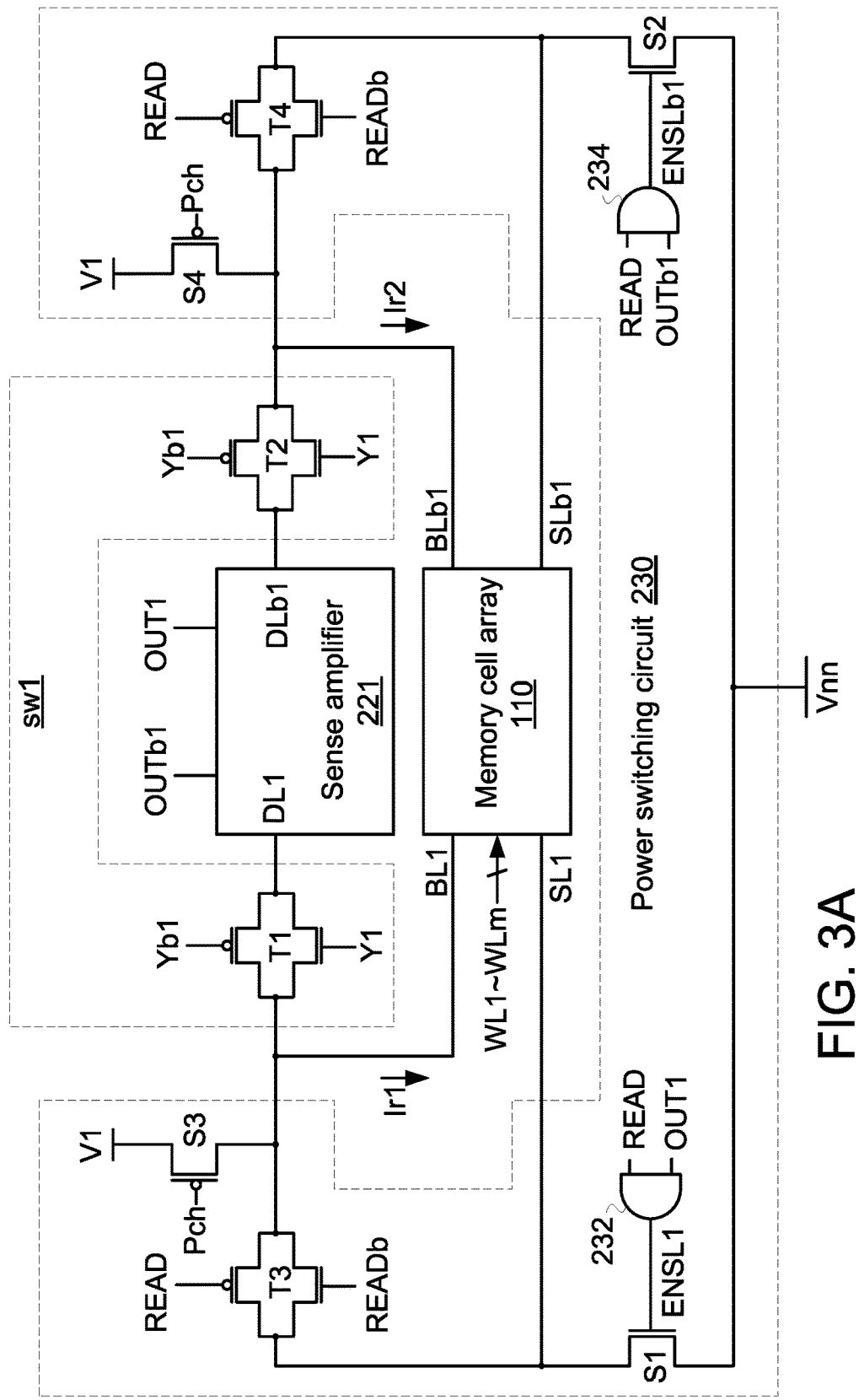
FIG. 3A is a schematic circuit diagram illustrating the architecture of a non-volatile memory according to a first embodiment of the present invention.

FIG. 3A is a schematic circuit diagram illustrating the architecture of a non-volatile memory according to a first embodiment of the present invention. For succinctness, only the connecting relationships between the bit line pair (BL1, BLb1), the source line pair (SL1, SLb1) and associated components are shown in FIG. 3A. The connecting relationships between the other bit line pairs, the other source line pairs and the associated components are similar and not redundantly described herein.

As shown in FIG. 3A, the switching element sw1 comprises a first switching circuit and a second switching circuit. The first switching circuit is a transmission gate T1. The second switching circuit is a transmission gate T2. A first terminal of the transmission gate T1 is connected with the bit line BL1. A second terminal of the transmission gate T1 is connected with a data line DL1. A control terminal of the transmission gate T1 receives a select signal Y1. An inverted control terminal of the transmission gate T1 receives an inverted select signal Yb1. A first terminal of the transmission gate T2 is connected with the inverted bit line BLb1. A second terminal of the transmission gate T2 is connected with an inverted data line DLb1. A control terminal of the transmission gate T2 receives the select signal Y1. An inverted control terminal of the transmission gate T2 receives the inverted select signal Yb1.

The transmission gate T1 comprises a p-type switch transistor and an n-type switch transistor. The gate terminal of the p-type switch transistor is the inverted control terminal of the transmission gate T1. The gate terminal of the n-type switch transistor is the control terminal of the transmission gate T1. The first terminal of the n-type switch transistor is connected with the first terminal of the transmission gate T1. The second terminal of the n-type switch transistor is connected with the second terminal of the transmission gate T1. The first terminal of the p-type switch transistor is connected with the first terminal of the n-type switch transistor. The second terminal of the p-type switch transistor is connected with the second terminal of the n-type switch transistor. The structure of the transmission gate T2 is similar to that of the transmission gate T1, and is not redundantly described herein.

The power switching circuit 230 comprises a first switching circuit, a second switching circuit, four switch transistors S1~S4 and AND gate 232, 234. The first switching circuit is a transmission gate T3. The second switching circuit is a transmission gate T4. The gate terminal of the switch transistor S1 receives a source line enabling signal ENSL1. The drain terminal of the switch transistor S1 is connected with the source line SL1. The source terminal of the switch transistor S1 receives a power voltage Vnn. The gate terminal of the switch transistor S2 receives an inverted source line enabling signal ENSLb1. The drain terminal of the switch transistor S2 is connected with the inverted source line SLb1. The source terminal of the switch transistor S2 receives a power voltage Vnn. The two input terminals of the AND gate 232 receive an output signal OUT1 and a read signal READ, respectively. The output terminal of the AND gate 232 generates the source line enabling signal ENSL1. The two input terminals of the AND gate 234 receive an inverted output signal OUTb1 and the read signal READ, respectively. The output terminal of the AND gate 234 generates the inverted source line enabling signal ENSLb1.

The gate terminal of the switch transistor S3 receives a pre-charge signal Pch. The source terminal of the switch transistor S3 receives a charging voltage V1. The drain terminal of the switch transistor S3 is connected with the bit line BL1. The gate terminal of the switch transistor S4 receives the pre-charge signal Pch. The source terminal of the switch transistor S4 receives the charging voltage V1. The drain terminal of the switch transistor S4 is connected with the inverted bit line BLb1.

A first terminal of the transmission gate T3 is connected with the bit line BL1. A second terminal of the transmission gate T3 is connected with the source line SL1. An inverted control terminal of the transmission gate T3 receives the read signal READ. A control terminal of the transmission gate T3 receives an inverted read signal READb. A first terminal of the transmission gate T4 is connected with the inverted bit line BLb1. A second terminal of the transmission gate T4 is connected with an inverted source line SLb1. An inverted control terminal of the transmission gate T4 receives the read signal READ. A control terminal of the transmission gate T4 receives the inverted read signal READb. The structures of the transmission gates T3 and T4 are similar to the structure of the transmission gate T1, and are not redundantly described herein.

While the read action is performed and before the signals from the data line pair (DL1, DLb1) are not judged by the sense amplifier 221, the output signal OUT1 and the inverted output signal OUTb1 from the sense amplifier 221 are maintained in a high level state. When the difference between the signals from the data line pair (DL1, DLb1) is judged by the sense amplifier 221, the sense amplifier 221 generates the complementary output signal set (OUT1, OUTb1). The read action of the non-volatile memory will be described as follows.

Figure 3B:
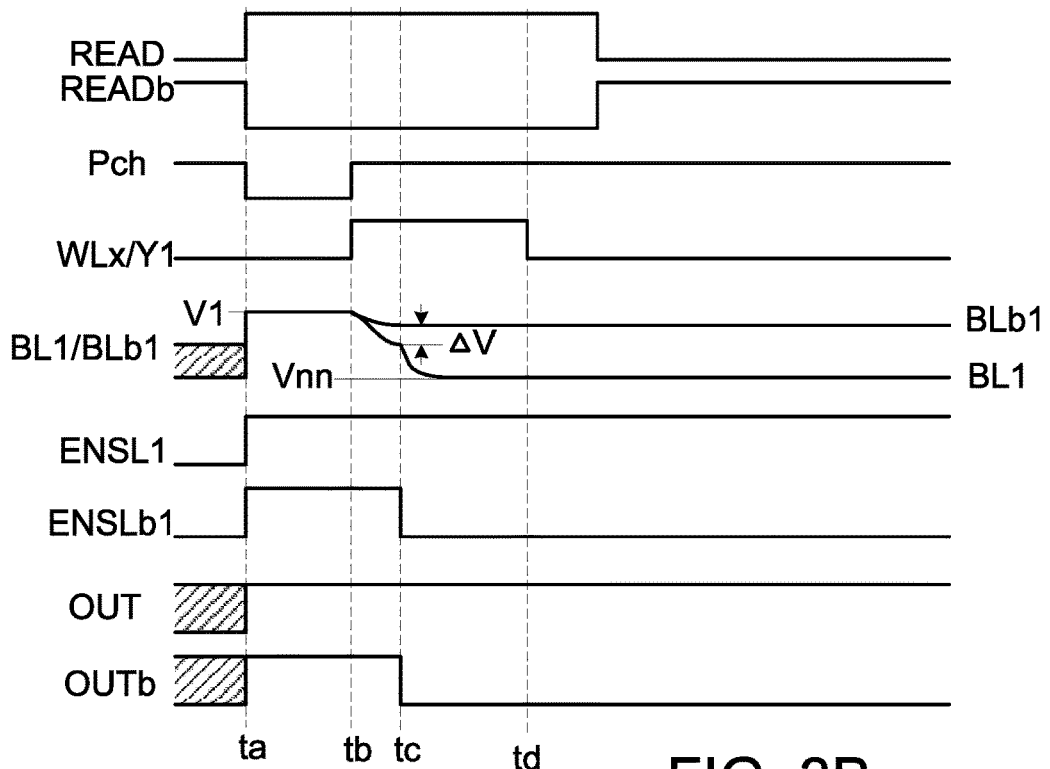
FIGS. 3B and 3C are schematic timing waveform diagrams illustrating associated signals of the non-volatile memory according to the first embodiment of the present invention.

FIG. 3B is a schematic timing waveform diagram illustrating associated signals of the non-volatile memory according to the first embodiment of the present invention. In case that the first sub-cell of the selected differential cell connected with the bit line BL1 and the source line SL1 is in the on state, the second sub-cell of the selected differential cell connected with the inverted bit line BLb1 and the inverted source line SLb1 is in the off state.

During the read cycle, the read signal READ is in the high level state and the inverted read signal READb is in the low level state. Consequently, the transmission gates T3 and T4 are in an open state, the bit line BL1 and the source line SL1 are disconnected, and the inverted bit line BLb1 and the inverted source line SLb1 are disconnected.

In the time interval between the time point to and the time point tb, the output signal OUT1, the inverted output signal OUTb1 and the read signal READ are all in the high level state. Consequently, both of the source line enabling signal ENSL1 and the inverted source line enabling signal ENSLb1 are in the high level state. Meanwhile, the switch transistors S1 and S2 are in the close state, and the source line SL1 and the inverted source line SLb1 are connected with the power voltage Vnn. In addition, the pre-charge signal Pc is temporarily in the low level state, and the switch transistors S3 and S4 are temporarily in the close state and then in the open state. Consequently, the bit line BL1 and the inverted bit line BLb1 are pre-charged to the charging voltage V1 and then in a floating state.

In the time interval between the time point tb and the time point td, the word line WLx is in the high level state. This time interval is an activation period of the word line WLx. Moreover, the time interval between the time point tb and the time point tc is a first period of the activation period, and the time interval between the time point tc and the time point td is a second period of the activation period. When the word line WLx is activated, a selected differential cell of the memory cell array 110 is determined. The first sub-cell of the selected differential cell is connected with the bit line BL1 and the source line SL1. The second sub-cell of the selected differential cell is connected with the inverted bit line BLb1 and the inverted source line SLb1.

In the first period of the activation period (i.e. the time interval between the time point tb and the time point tc), the select signal Y1 is activated (i.e., in the high level state). Consequently, the bit line BL1 is connected with the data line DL1, and the inverted bit line BLb1 is connected with the inverted data line DLb1. Moreover, since the word line WLx is activated (i.e., in the high level state), two current paths are formed in the selected differential cell to generate a first read current Ir1 and a second read current Ir2. In the first current path, the first read current Ir1 flows from the data line DL to the power switching circuit 230 through the transmission gate T1, the bit line BL1, the first sub-cell and the source line SL1. In the second current path, the second read current Ir2 flows from the inverted data line DLb to the power switching circuit 230 through the transmission gate T2, the inverted bit line BLb1, the second sub-cell and the inverted source line SLb1.

As mentioned above, the first read current Ir1 and the second read current Ir2 are generated in the time interval between the time point tb and the time point tc. Consequently, the bit line BL1 and the inverted bit line BLb1 are discharged from the charging voltage V1. Moreover, since the first sub-cell of the selected differential cell is in the on state and the second sub-cell of the selected differential cell is in the off state, the first read current Ir1 is higher than the second read current Ir2. Consequently, the voltage drop speed of the bit line BL1 is faster than the voltage drop speed of the inverted bit line BLb1.

At the time point tc, the voltage difference ΔV between the bit line BL1 and the inverted bit line BLb1 exceeds a threshold value of the sense amplifier 221, the output signal OUT1 is in the high level state and the inverted output signal OUTb1 is in the low level state.

Since the output signal OUT1 is in the high level state and the inverted output signal OUTb1 is in the low level state, the source line enabling signal ENSL1 outputted from the AND gate 232 of the power switching circuit 230 is in the high level state. Under this circumstance, the switch transistor S1 is maintained in the close state. At the same time, the inverted source line enabling signal ENSLb1 outputted from the AND gate 234 of the power switching circuit 230 is in the low level state. Under this circumstance, the switch transistor S2 is changed to the open state.

Obviously, at the time point tc, the switch transistor S2 is in the open state. Consequently, the second current path is opened, and the inverted bit line BLb1 is in the floating state. Meanwhile, the second read current Ir2 is not generated. Moreover, the first current path continuously generates the first read current Ir1, and the voltage of the bit line BL1 is quickly discharged to the power voltage Vnn.

At the time point td, the activation period of the word line WLx is ended. As mentioned above, the time interval between the time point tb and the time point td is the activation period of the word line WLx. However, in the time interval between the time point tc and the time point td, the second current path is opened and the second read current Ir2 is not generated.

Please refer to FIG. 3B again. While the read action is performed in the activation period of the word line WLx, only one of the two current paths of the differential cell is opened in the second period. That is, the second current path is opened in the second period. Consequently, while the read action is performed, the power consumption of the non-volatile memory is effectively reduced. As shown in FIG. 3B, the second current path generating the lower read current is opened.

Figure 3C:
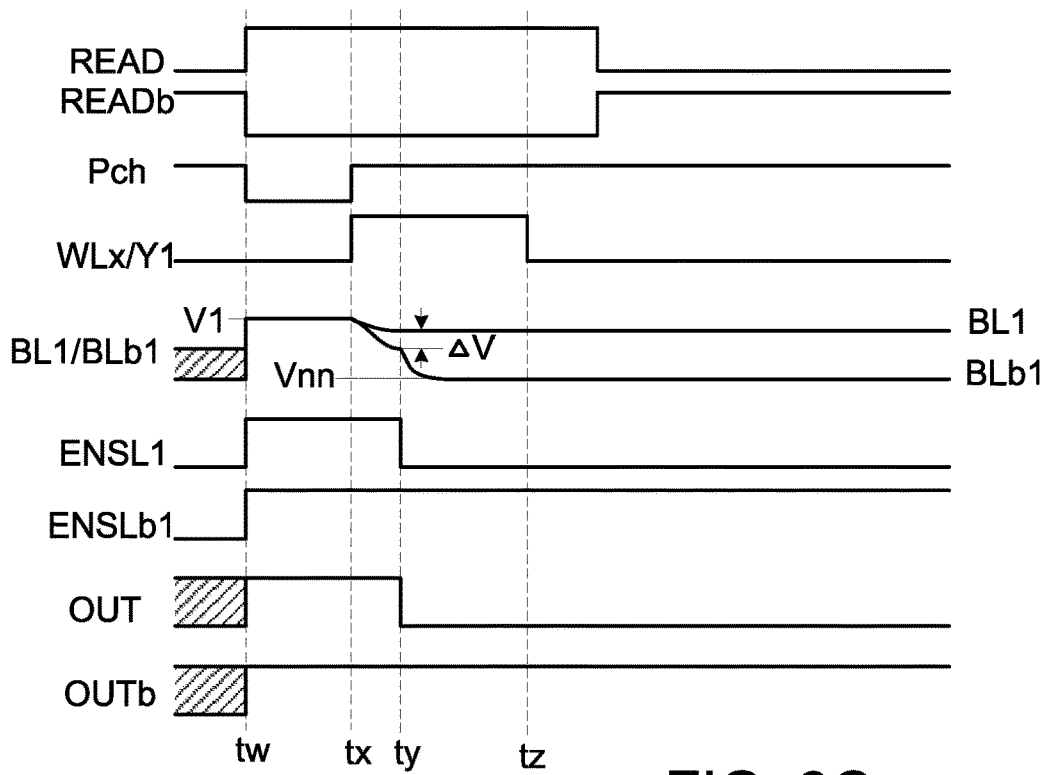

FIG. 3C is a schematic timing waveform diagram illustrating associated signals of the non-volatile memory according to the first embodiment of the present invention. In case that the first sub-cell of the selected differential cell connected with the bit line BL1 and the source line SL1 is in the off state, the second sub-cell of the selected differential cell connected with the inverted bit line BLb1 and the inverted source line SLb1 is in the on state.

In the time interval between the time point tw and the time point tx, both of the source line enabling signal ENSL1 and the inverted source line enabling signal ENSLb1 are in the high level state. Meanwhile, the switch transistors S1 and S2 are in the close state, and the source line SL1 and the inverted source line SLb1 are connected with the power voltage Vnn. In addition, the pre-charge signal Pc is temporarily in the low level state, and the switch transistors S3 and S4 are temporarily in the close state and then in the open state. Consequently, the bit line BL1 and the inverted bit line BLb1 are pre-charged to the charging voltage V1 and then in a floating state.

In the time interval between the time point tx and the time point tz, the word line WLx is in the high level state. This time interval is an activation period of the word line WLx. Moreover, the time interval between the time point tx and the time point ty is a first period of the activation period, and the time interval between the time point ty and the time point tz is a second period of the activation period.

In the time interval between the time point tx and the time point ty, the select signal Y1 is activated (i.e., in the high level state). Consequently, the bit line BL1 is connected with the data line DL1, and the inverted bit line BLb1 is connected with the inverted data line DLb1. Moreover, since the word line WLx is activated (i.e., in the high level state), two current paths are formed in the selected differential cell to generate a first read current Ir1 and a second read current Ir2. The first sub-cell generates the first read current Ir1 to the first current path. The second sub-cell generates the second read current Ir2 to the second current path. In the first current path, the first read current Ir1 flows from the data line DL to the power voltage Vnn through the transmission gate T1, the bit line BL1, the first sub-cell, the source line SL1 and the switch transistor S1. In the second current path, the second read current Ir2 flows from the inverted data line DLb to the power switching circuit 230 through the transmission gate T2, the inverted bit line BLb1, the second sub-cell, the inverted source line SLb1 and the switch transistor S1.

As mentioned above, the first read current Ir1 and the second read current Ir2 are generated in the time interval between the time point tx and the time point ty. Consequently, the bit line BL1 and the inverted bit line BLb1 are discharged from the charging voltage V1. Moreover, since the first sub-cell of the selected differential cell is in the off state and the second sub-cell of the selected differential cell is in the on state, the second read current Ir2 is higher than the first read current Ir1. Consequently, the voltage drop speed of the inverted bit line BLb1 is faster than the voltage drop speed of the bit line BL1. At the time point ty, the voltage difference ΔV between the bit line BL1 and the inverted bit line BLb1 exceeds a threshold value of the sense amplifier 221, the output signal OUT1 is in the low level state and the inverted output signal OUTb1 is in the high level state.

Since the output signal OUT1 is in the low level state and the inverted output signal OUTb1 is in the high level state, the source line enabling signal ENSL1 outputted from the AND gate 232 of the power switching circuit 230 is in the low level state. Under this circumstance, the switch transistor S1 is changed to the open state. At the same time, the inverted source line enabling signal ENSLb1 outputted from the AND gate 234 of the power switching circuit 230 is in the high level state. Under this circumstance, the switch transistor S1 is maintained in the close state.

Obviously, at the time point tc, the switch transistor S1 is in the open state. Consequently, the first current path is opened, and the bit line BL1 is in the floating state. Meanwhile, the first read current Ir1 is not generated. Moreover, the second current path continuously generates the second read current Ir2, and the voltage of the inverted bit line BLb1 is quickly discharged to the power voltage Vnn.

At the time point tz, the activation period of the word line WLx is ended. As mentioned above, the time interval between the time point tx and the time point tz is the activation period of the word line WLx. However, in the time interval between the time point ty and the time point tz, the first current path is opened and the first read current Ir1 is not generated.

Please refer to FIG. 3C again. While the read action is performed in the activation period of the word line WLx, only one of the two current paths of the differential cell is opened in the second period. That is, the first current path is opened in the second period. Consequently, while the read action is performed, the power consumption of the non-volatile memory is effectively reduced. As shown in FIG. 3C, the first current path generating the lower read current is opened.

In a word, the first current path and the second current path are controlled to be opened according to the correlation of the first read current and the second read current. That is, if the second read current is higher than the first read current, the first current path is opened in the second period, and if the first read current is higher than the second read current, the second current path is opened in the second period.

Figure 4:
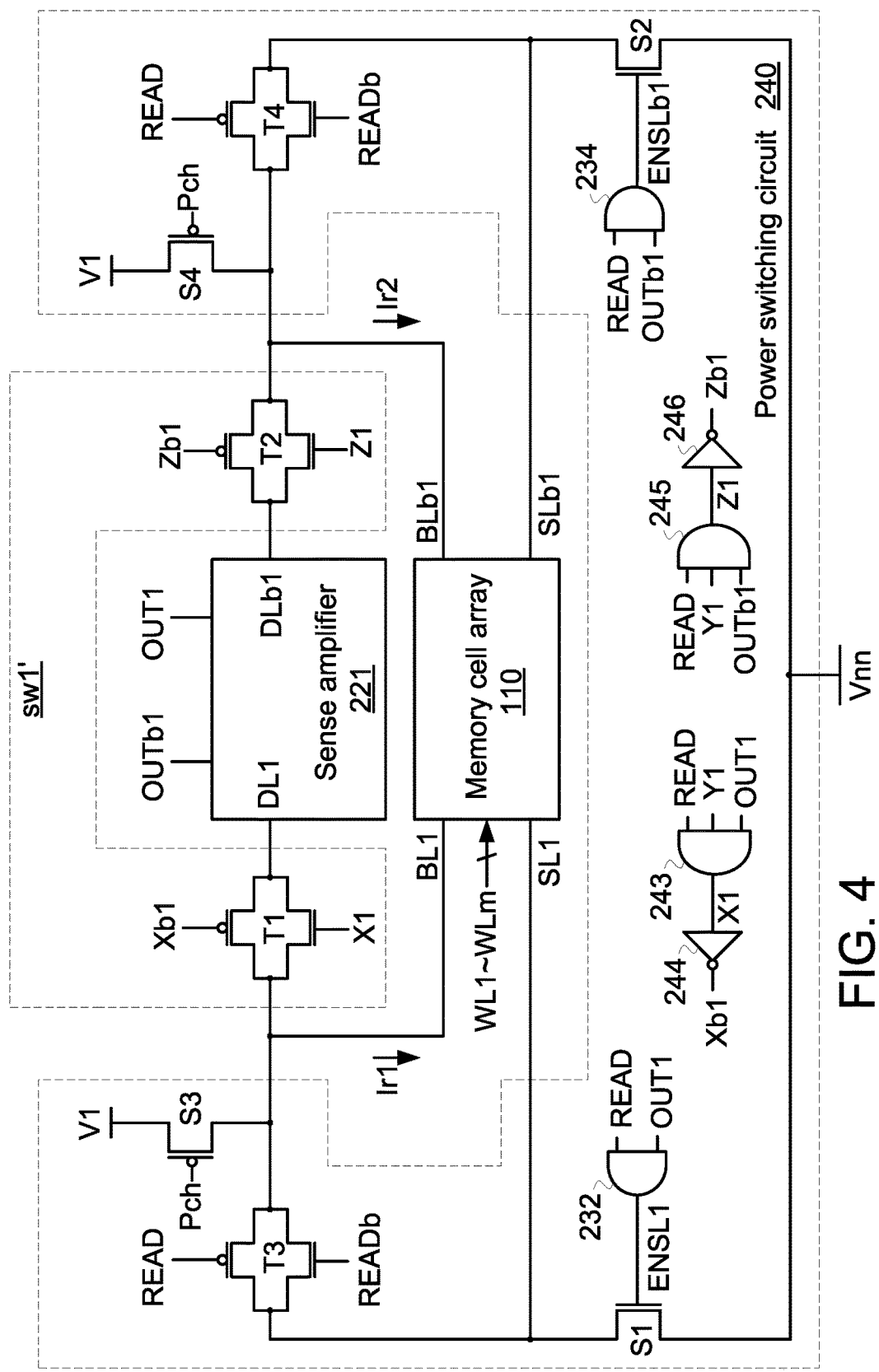
FIG. 4 is a schematic circuit diagram illustrating the architecture of a non-volatile memory according to a second embodiment of the present invention.

FIG. 4 is a schematic circuit diagram illustrating the architecture of a non-volatile memory according to a second embodiment of the present invention. In comparison with the first embodiment, the power switching circuit 240 and the switching element sw1' of this embodiment are distinguished. Hereinafter, only the power switching circuit 240 and the switching element sw1' will be described.

As shown in FIG. 4, the switching element sw1' comprises a first switching circuit and a second switching circuit. The first switching circuit is a transmission gate T1. The second switching circuit is a transmission gate T2. A first terminal of the transmission gate T1 is connected with the bit line BL1. A second terminal of the transmission gate T1 is connected with a data line DL1. A control terminal of the transmission gate T1 receives a first control signal X1. An inverted control terminal of the transmission gate T1 receives an inverted first control signal Xb1. A first terminal of the transmission gate T2 is connected with the inverted bit line BLb1. A second terminal of the transmission gate T2 is connected with an inverted data line DLb1. A control terminal of the transmission gate T2 receives a second control signal Z1. An inverted control terminal of the transmission gate T2 receives an inverted second control signal Zb1.

In comparison with the power switching circuit 230 of the first embodiment, the power switching circuit 240 of the second embodiment further comprises two AND gates 243, 245 and two NOT gates 244, 246. The three input terminals of the AND gate 243 receive the output signal OUT1, the select signal Y1 and the read signal READ, respectively. The output terminal of the AND gate 243 generates the first control signal X1. The input terminal of the NOT gate 244 receives the first control signal X1. The output terminal of the NOT gate 244 generates the inverted first control signal Xb1. The three input terminals of the AND gate 245 receive the inverted output signal OUTb1, the select signal Y1 and the read signal READ, respectively. The output terminal of the AND gate 245 generates the second control signal Z1. The input terminal of the NOT gate 246 receives the second control signal Z1. The output terminal of the NOT gate 246 generates the inverted second control signal Zb1.

Similarly, in the activation period of the word line WLx, the select signal Y1 is activated (i.e., in the high level state). Consequently, the first control signal X1 and the second control signal Z1 are in the high level state, and the inverted first control signal Xb1 and the inverted second control signal Zb1 are in the low level state. Consequently, the bit line BL1 is connected with the data line DL1, and the inverted bit line BLb1 is connected with the inverted data line DLb1. Moreover, two current paths are formed in the selected differential cell to generate a first read current Ir1 and a second read current Ir2. The first sub-cell generates the first read current Ir1 to the first current path. The second sub-cell generates the second read current Ir2 to the second current path. In the first current path, the first read current Ir1 flows from the data line DL to the power switching circuit 240 through the transmission gate T1, the bit line BL1, the first sub-cell, the source line SL1 and the switch transistor S1. In the second current path, the second read current Ir2 flows from the inverted data line DLb to the power switching circuit 240 through the transmission gate T2, the inverted bit line BLb1, the second sub-cell, the inverted source line SLb1 and the switch transistor S1.

When the sense amplifier 221 generates the complementary output signal set (OUT1, OUTb1), one of the two current paths is changed to the open state. For example, the first read current Ir1 is higher than the second read current Ir2. If the output signal OUT1 is in the high level state and the inverted output signal OUTb1 is in the low level state, the inverted source line enabling signal ENSLb1 and the second control signal Z1 are in the low level state. Consequently, the switch transistor S2 and the transmission gate T2 are in the open state. Since the second current path generates the lower read current in the second period, the second current path is opened.

For example, the second read current Ir2 is higher than the first read current Ir1. If the output signal OUT1 is in the low level state and the inverted output signal OUTb1 is in the high level state, the source line enabling signal ENSL1 and the first control signal X1 are in the low level state. Consequently, the switch transistor S1 and the transmission gate T1 are in the open state. Since the first current path generates the lower read current in the second period, the first current path is opened.

In other words, while the non-volatile memory of the second embodiment performs the read action, the switch transistor and the transmission gate in one current path are in the open state and the current path is opened. Consequently, while the read action is performed, the power consumption of the non-volatile memory is effectively reduced.

Figure 5:
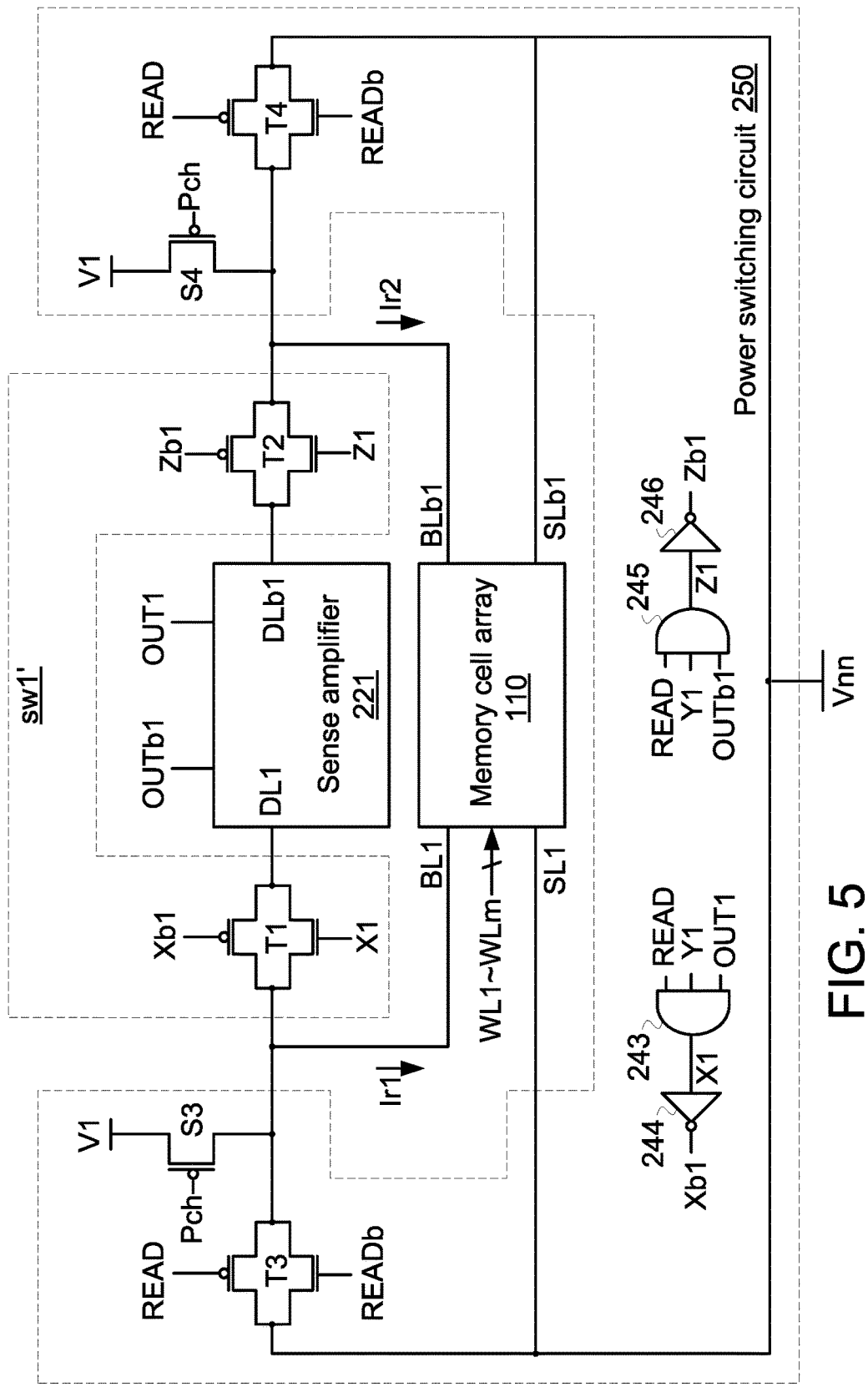
FIG. 5 is a schematic circuit diagram illustrating the architecture of a non-volatile memory according to a third embodiment of the present invention.

FIG. 5 is a schematic circuit diagram illustrating the architecture of a non-volatile memory according to a third embodiment of the present invention. In comparison with the second embodiment, the power switching circuit 250 of this embodiment are distinguished. Hereinafter, only the power switching circuit 250 will be described.

In comparison with the power switching circuit 240 of the second embodiment, the source line SL1 and the inverted source line SLb1 of this embodiment receive the power voltage Vnn directly. That is, the power switching circuit 250 is not equipped with the switch transistors S1, S2 and the AND gates 232, 234.

Similarly, in the activation period of the word line WLx, the select signal Y1 is activated (i.e., in the high level state). Consequently, the first control signal X1 and the second control signal Z1 are in the high level state, and the inverted first control signal Xb1 and the inverted second control signal Zb1 are in the low level state. Consequently, the bit line BL1 is connected with the data line DL1, and the inverted bit line BLb1 is connected with the inverted data line DLb1. Moreover, two current paths are formed in the selected differential cell to generate a first read current Ir1 and a second read current Ir2. The first sub-cell generates the first read current Ir1 to the first current path. The second sub-cell generates the second read current Ir2 to the second current path. In the first current path, the first read current Ir1 flows from the data line DL to the power switching circuit 250 through the transmission gate T1, the bit line BL1, the first sub-cell, the source line SL1 and the switch transistor S1. In the second current path, the second read current Ir2 flows from the inverted data line DLb to the power switching circuit 250 through the transmission gate T2, the inverted bit line BLb1, the second sub-cell, the inverted source line SLb1 and the switch transistor S1.

When the sense amplifier 221 generates the complementary output signal set (OUT1, OUTb1), one of the two current paths is changed to the open state. For example, the first read current Ir1 is higher than the second read current Ir2. If the output signal OUT1 is in the high level state and the inverted output signal OUTb1 is in the low level state, the second control signal Z1 is in the low level state. Consequently, the transmission gate T2 is in the open state. Since the second current path generates the lower read current in the second period, the second current path is opened.

For example, the second read current Ir2 is higher than the first read current Ir1. If the output signal OUT1 is in the low level state and the inverted output signal OUTb1 is in the high level state, the first control signal X1 is in the low level state. Consequently, the transmission gate T1 is in the open state. Since the first current path generates the lower read current in the second period, the first current path is opened.

In other words, while the non-volatile memory of the second embodiment performs the read action, the switch transistor and the transmission gate in one current path are in the open state and the current path is opened. Consequently, while the read action is performed, the power consumption of the non-volatile memory is effectively reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A non-volatile memory, comprising:
    a memory cell array comprising a word line, a bit line, an inverted bit line, a source line and an inverted source line, wherein a first sub-cell of a selected differential cell is connected with the word line, the bit line and the source line, and a second sub-cell of the selected differential cell is connected with the word line, the inverted bit line and the inverted source line;
    a sense amplifier comprising a data line and an inverted data line, wherein the sense amplifier generates an output signal and an inverted output signals according to signals from the data line and the inverted data line;
    a switching element comprising a first switching circuit and a second switching circuit, wherein the first switching circuit is connected between the data line and the bit line, and the second switching circuit is connected between the inverted data line and the inverted bit line;
    a power switching circuit connected with the bit line, the inverted bit line, the source line and the inverted source line,
    wherein during a read cycle, an activation period of the word line contains a first period and a second period, wherein in the first period, the first sub-cell generates a first read current to a first current path, which is defined by the data line, the first switching circuit, the bit line, the first sub-cell, the source line and the power switching circuit, wherein in the first period, the second sub-cell generates a second read current to a second current path, which is defined by the inverted data line, the second switching circuit, the inverted bit line, the second sub-cell, the inverted source line and the power switching circuit,
    wherein the first current path and the second current path are controlled to be opened according to the correlation of the first read current and the second read current.

2. The non-volatile memory as claimed in claim 1, wherein if the first read current is higher than the second read current, the second current path is opened in the second period, wherein if the second read current is higher than the first read current, the first current path is opened in the second period.

3. The non-volatile memory as claimed in claim 1, wherein the first switching circuit is a first transmission gate, and the second switching circuit is a second transmission gate, wherein a first terminal of the first transmission gate is connected with the bit line, a second terminal of the first transmission gate is connected with the data line, a control terminal of the first transmission gate receives a select signal, and an inverted control terminal of the first transmission gate receives an inverted select signal, wherein a first terminal of the second transmission gate is connected with the inverted bit line, a second terminal of the second transmission gate is connected with the inverted data line, a control terminal of the second transmission gate receives the select signal, and an inverted control terminal of the second transmission gate receives the inverted select signal.

4. The non-volatile memory as claimed in claim 3, wherein the power switching circuit comprises:
    a first switch transistor, wherein a first terminal of the first switch transistor receives a power voltage, a second terminal of the first switch transistor is connected with the source line, and a control terminal of the first switch transistor receives a source line enabling signal;
    a second switch transistor, wherein a first terminal of the second switch transistor receives the power voltage, a second terminal of the second switch transistor is connected with the inverted source line, and a control terminal of the second switch transistor receives an inverted source line enabling signal;
    a first AND gate, wherein a first input terminal of the first AND gate receives a read signal, a second input terminal of the first AND gate receives the output signal, and an output terminal of the first AND gate generates the source line enabling signal;
    a second AND gate, wherein a first input terminal of the second AND gate receives the read signal, a second input terminal of the second AND gate receives the inverted output signal, and an output terminal of the second AND gate generates the inverted source line enabling signal;
    a third switching circuit connected between the bit line and the source line;
    a fourth switching circuit connected between the inverted bit line and the inverted source line, wherein during the read cycle, the third switching circuit and the fourth switching circuit are in an open state;
    a third switch transistor, wherein a first terminal of the third switch transistor receives a charging voltage, a second terminal of the third switch transistor is connected with the bit line, and a control terminal of the third switch transistor receives a pre-charge signal; and
    a fourth switch transistor, wherein a first terminal of the fourth switch transistor receives the charging voltage, a second terminal of the fourth switch transistor is connected with the inverted bit line, and a control terminal of the fourth switch transistor receives the pre-charge signal.

5. The non-volatile memory as claimed in claim 4, wherein during the read cycle, the read signal is in a high level state, wherein before the activation period, the third switch transistor and the fourth switch transistor are controlled according to the pre-charge signal, so that the bit line and the inverted bit line are pre-charged to the charging voltage, wherein in the activation period, the select signal is in the high level state.

6. The non-volatile memory as claimed in claim 1, wherein the first switching circuit is a first transmission gate, and the second switching circuit is a second transmission gate, wherein a first terminal of the first transmission gate is connected with the bit line, a second terminal of the first transmission gate is connected with the data line, a control terminal of the first transmission gate receives a first control signal, and an inverted control terminal of the first transmission gate receives an inverted first control signal, wherein a first terminal of the second transmission gate is connected with the inverted bit line, a second terminal of the second transmission gate is connected with the inverted data line, a control terminal of the second transmission gate receives a second control signal, and an inverted control terminal of the second transmission gate receives an inverted second control signal.

7. The non-volatile memory as claimed in claim 6, wherein the power switching circuit comprises:
- a first switch transistor, wherein a first terminal of the first switch transistor receives a power voltage, a second terminal of the first switch transistor is connected with the source line, and a control terminal of the first switch transistor receives a source line enabling signal;
- a second switch transistor, wherein a first terminal of the second switch transistor receives the power voltage, a second terminal of the second switch transistor is connected with the inverted source line, and a control terminal of the second switch transistor receives an inverted source line enabling signal;
- a first AND gate, wherein a first input terminal of the first AND gate receives a read signal, a second input terminal of the first AND gate receives the output signal, and an output terminal of the first AND gate generates the source line enabling signal;
- a second AND gate, wherein a first input terminal of the second AND gate receives the read signal, a second input terminal of the second AND gate receives the inverted output signal, and an output terminal of the second AND gate generates the inverted source line enabling signal;
- a third AND gate, wherein a first input terminal of the third AND gate receives the read signal, a second input terminal of the third AND gate receives a select signal, a third input terminal of the third AND gate receives the output signal, and an output terminal of the third AND gate generates the first control signal;
- a fourth AND gate, wherein a first input terminal of the fourth AND gate receives the read signal, a second input terminal of the fourth AND gate receives the select signal, a third input terminal of the fourth AND gate receives the inverted output signal, and an output terminal of the fourth AND gate generates the second control signal;
- a first NOT gate, wherein an input terminal of the first NOT gate receives the first control signal, and an output terminal of the first NOT gate generates the inverted first control signal;
- a second NOT gate, wherein an input terminal of the second NOT gate receives the second control signal, and an output terminal of the second NOT gate generates the inverted second control signal;
- a third switching circuit connected between the bit line and the source line;
- a fourth switching circuit connected between the inverted bit line and the inverted source line, wherein during the read cycle, the third switching circuit and the fourth switching circuit are in an open state;
- a third switch transistor, wherein a first terminal of the third switch transistor receives a charging voltage, a second terminal of the third switch transistor is connected with the bit line, and a control terminal of the third switch transistor receives a pre-charge signal; and
- a fourth switch transistor, wherein a first terminal of the fourth switch transistor receives the charging voltage, a second terminal of the fourth switch transistor is connected with the inverted bit line, and a control terminal of the fourth switch transistor receives the pre-charge signal.

8. The non-volatile memory as claimed in claim 7, wherein during the read cycle, the read signal is in a high level state, wherein before the activation period, the third switch transistor and the fourth switch transistor are controlled according to the pre-charge signal, so that the bit line and the inverted bit line are pre-charged to the charging voltage, wherein in the activation period, the select signal is in the high level state.

9. The non-volatile memory as claimed in claim 6, wherein the power switching circuit comprises:
- a first AND gate, wherein a first input terminal of the first AND gate receives a read signal, a second input terminal of the first AND gate receives a select signal, a third input terminal of the first AND gate receives the output signal, and an output terminal of the first AND gate generates the first control signal;
- a second AND gate, wherein a first input terminal of the second AND gate receives the read signal, a second input terminal of the second AND gate receives the select signal, a third input terminal of the second AND gate receives the inverted output signal, and an output terminal of the second AND gate generates the second control signal;
- a first NOT gate, wherein an input terminal of the first NOT gate receives the first control signal, and an output terminal of the first NOT gate generates the inverted first control signal;
- a second NOT gate, wherein an input terminal of the second NOT gate receives the second control signal, and an output terminal of the second NOT gate generates the inverted second control signal;
- a third switching circuit connected between the bit line and the source line, wherein the source line receives a power voltage;
- a fourth switching circuit connected between the inverted bit line and the inverted source line, wherein the inverted source line receives the power voltage, wherein during the read cycle, the third switching circuit and the fourth switching circuit are in an open state;
- a third switch transistor, wherein a first terminal of the third switch transistor receives a charging voltage, a second terminal of the third switch transistor is connected with the bit line, and a control terminal of the third switch transistor receives a pre-charge signal; and a fourth switch transistor, wherein a first terminal of the fourth switch transistor receives the charging voltage, a second terminal of the fourth switch transistor is connected with the inverted bit line, and a control terminal of the fourth switch transistor receives the pre-charge signal.

10. The non-volatile memory as claimed in claim 9, wherein during the read cycle, the read signal is in a high level state, wherein before the activation period, the third switch transistor and the fourth switch transistor are controlled according to the pre-charge signal, so that the bit line and the inverted bit line are pre-charged to the charging voltage, wherein in the activation period, the select signal is in the high level state.

* * * * *